United States Patent [19]

Dingwall

[11] Patent Number: 4,978,925
[45] Date of Patent: Dec. 18, 1990

[54] UNITY-GAIN CMOS/SOS ZERO-OFFSET BUFFER

[75] Inventor: Andrew G. F. Dingwall, Princeton, N.J.

[73] Assignee: Harris Corporation, Melbourne, Fla.

[21] Appl. No.: 356,311

[22] Filed: May 24, 1989

[51] Int. Cl.$^5$ .............................................. H03F 3/16
[52] U.S. Cl. ........................................ 330/277; 330/85
[58] Field of Search .................. 330/9, 277, 288, 290, 330/296, 85; 307/497

[56] References Cited

U.S. PATENT DOCUMENTS 4,612,514  9/1986  Shigaki et al. ...................... 330/277
4,714,845  12/1987  Devecchi et al. ............... 307/497 X

FOREIGN PATENT DOCUMENTS 0126306  7/1984  Japan .................................. 330/277

Primary Examiner—Steven Mottola
Attorney, Agent, or Firm—Henry I. Schanzer

[57] ABSTRACT

A near unity gain, essentially zero-offset, high input impedance, relatively low output impedance, fast responding buffer circuit uses first and second essentially identical n-channel depletion mode MOS transistors with the drain-source circuitries serially connected together and with the gate and source of the second transistor connected together. A first feedback circuit, which uses a first n-channel enhancement mode MOS transistor as a voltage level shifter and a third n-channel depletion mode MOS transistor as a source follower, is connected between the source and drain of the first transistor. A second feedback circuit, which uses a second n-channel enhancement mode MOS transistor as a voltage level shifter and a fourth n-channel depletion mode MOS transistor as a source follower, is connected between the source and drain of the second transistor. The gate and source of the first transistor serve as the buffer input and output terminals, respectively.

32 Claims, 1 Drawing Sheet

FIGURE
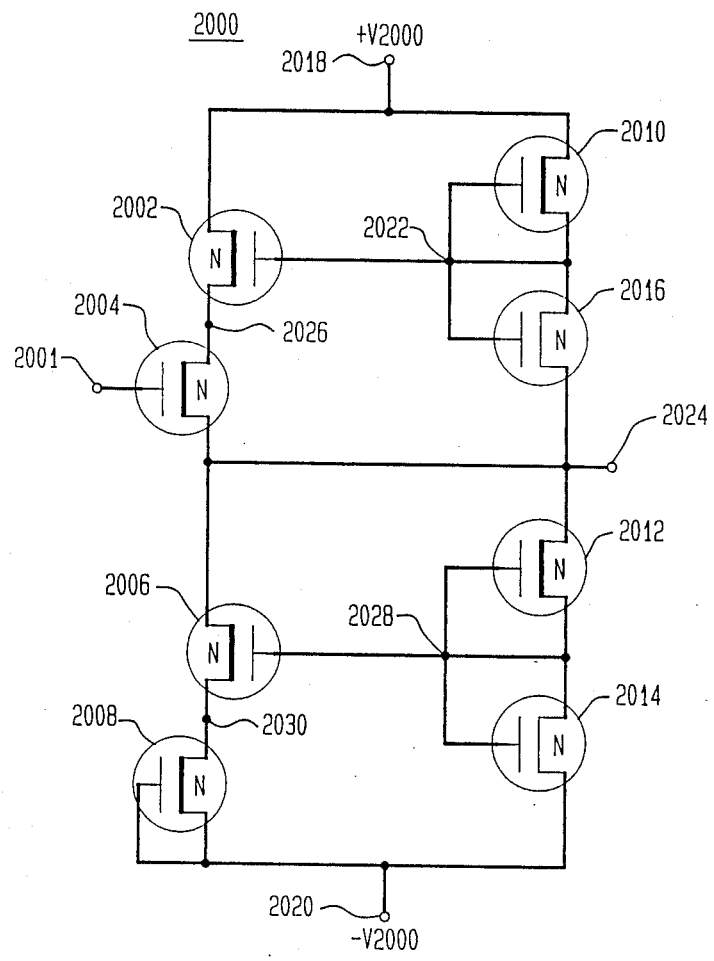

UNITY-GAIN CMOS/SOS ZERO-OFFSET BUFFER

FIELD OF THE INVENTION

This invention relates to buffer circuits and in particular to a solid-state buffer circuit which has near unity gain, high input impedance, low output impedance and relatively fast response time.

BACKGROUND OF THE INVENTION

In a variety of applications, including high speed Analog-to-Digital Converters, there exists a need for a high speed near unity gain amplifier (buffer) which has high input impedance (typically at or above about $10^6$ ohms), relatively low output impedance (typically about $10^3$ ohms or less), and relatively fast response time (typically 10 nanoseconds seconds or less) and relatively low offset voltage (typically 5 millivolts or less).

One prior art buffer circuit consists of the series combination of two n-channel depletion mode transistors with the drain of the first transistor connected to a positive voltage source, the source of the first transistor connected to the drain of the second transistor and to a buffer output terminal, and with the gate and source of the second transistor connected to a negative voltage source. The gate of the first transistor serves as the buffer input terminal. The second transistor serves as an essentially constant current source. The gate-to-drain voltage of each of the transistors varies as the potential level of an input signal varies. This results in the gain of the buffer being typically below 0.95 (with a transistor channel length of about 2 microns or less) which is not acceptable in some applications.

Another circuit useful as a buffer is an operational amplifier with the output connected to the negative input terminal and with the positive input terminal serving as the buffer input terminal. The output of the amplifier serves as the buffer output terminal. Delay around the loop of the amplifier can cause ringing and a relatively low bandwidth resulting in poor response to high frequency signals.

It is desirable to have a buffer circuit which has relatively high input impedance, relatively low output impedance, near unity gain, relatively fast response time and which can be fabricated using metal-oxide-silicon (MOS) transistors formed in the silicon of a silicon-on-sapphire substrate or in bulk silicon.

SUMMARY OF THE INVENTION

One aspect of the present invention is directed to a buffer which is circuitry comprising first and second essentially identical depletion mode field effect transistors, a first feedback circuit means coupled to first and second output terminals of the first transistor and a second feedback circuit means coupled to first and second output terminals of the second transistor. The first output terminal of the first transistor is coupled to the first output terminal of the second transistor. The gate and the second output terminal of the second transistor are coupled together. The first feedback circuit means establishes a fixed voltage across the first and second output terminals of the first transistor during operation of the circuitry. The second circuit means establishes a fixed voltage across the first and second output terminals of the second transistor during operation of the circuitry. The first and second feedback circuits are adapted such that the voltage across the output terminals of the first transistor is essentially equal to the voltage across the output terminals of the second transistor during operation of the circuitry.

The circuitry is configured such that during operation thereof the same current flows through the first and second transistors and the voltage across the output terminals of both transistors is essentially the same and stays essentially constant even with variations of the voltage level of an input signal applied to the gate of the first transistor. This causes the first transistor to act as a near ideal source follower in which signals applied to the gate thereof appear at the source thereof without essentially any voltage offset. The electrical characteristics of the first depletion mode field effect transistor provide the buffer with a high input impedance, relatively low output impedance and a relatively fast response time.

Viewed from another aspect, the invention is directed to a combination comprising first and second field effect transistors each having first and second electrodes defining the ends of a conduction path and a gate electrode for controlling the conductivity of the conduction path. The second transistor has a threshold voltage which is greater than the theshold voltage of the first transistor. The combination further comprises feedback means, including the gate and first electrode of the second transistor, coupled to the first and second electrodes of the first transistor for establishing a potential across the conduction path of the first transistor which is substantially equal to the threshold voltage of the second transistor.

The invention will be better under stood from the following more detailed description taken with the accompanying drawings and claims.

BRIEF DESCRIPTION OF THE DRAWINGS

The FIGURE shows in schematic circuit form an embodiment in accordance with the invention.

DETAILED DESCRIPTION

Referring now to the FIGURE, there is shown buffer circuitry 2000 in accordance with an embodiment of the present invention. Buffer circuitry 2000 comprises n-channel depletion mode field effect transistors (FET's) 2002, 2004, 2006, 2008, 2010, and 2012 and n-channel enhancement mode field effect transistors (FET's) 2014 and 2016. Each of the transistors has a gate, a source, and a drain. The source and drain may be denoted as first and second output terminals or as second and first output terminals or as first and second electrodes or as second and first electrodes. A channel region between the drain and source may be denoted as a conduction path which is located between and/or defined by the first and second electrodes. A buffer circuitry 2000 input terminal 2001 is coupled to the gate of transistor 2004 and a buffer circuit output terminal 2024 is coupled to the sources of transistors 2004 and 2016 and to the drains of transistors 2006 and 2012. Buffer circuitry 2000 is characterized in that it has a relatively high input impedance, a relatively low output impedance, and has essentially zero-offset voltage (i.e, the voltage level of an output signal (not shown) generated by buffer circuitry 2000 at output terminal 2024 has essentially the same voltage level as an input signal (not shown) applied to input terminal 2001.

In a typical embodiment transistors 2004 and 2008 are essentially identical, transistors 2002 and 2006 are essentially identical, transistors 2010 and 2012 are essentially identical and transistors 2014 and 2016 are essentially identical. All of the transistors are typically metal-oxide-silicon (MOS) transistors which can be fabricated in the silicon of a silicon-on-sapphire (SOS) substrate or in bulk silicon.

The drains of transistors 2002 and 2010 are coupled together to a terminal 2018 and to a positive voltage supply +V2000. The gate and source of transistor 2008 are coupled to the source of transistor 2014, to a terminal 2020 and to a negative voltage source −V2000.

The gate of transistor 2002 is coupled to the gates of transistors 2010 and 2016, to the source of transistor 2010, to the drain of transistor 2016, and to a terminal 2022. The source of transistor 2002 is coupled to the drain of transistor 2004 and to a terminal 2026. The gates of transistors 2006, 2012 and 2014 are coupled to the source of transistor 2012, to the drain of transistor 2014, and to a terminal 2028. The source of transistor 2006 is coupled to the drain of transistor 2008 and to a terminal 2030.

As will be come clear from the following description, transistor 2004 acts essentially as a near ideal source follower with essentially no offset voltage. Thus with a given voltage level applied to input terminal 2001 (the gate of transistor 2004), the same voltage level appears at output terminal 2024. Transistor 2004 is an MOS transistor and thus its input impedance is high and its output impedance is relatively low. The delay time associated with transistor 2004 is relatively small since it is a depletion mode MOS transistor which is a normally on device. Accordingly, the response time of transistor 2004 is relatively fast.

Transistors 2016 and 2002 form a first feedback circuit (also denoted as a first feedback circuit means or as a first voltage clamp circuit) from output terminal 2024 (the source of transistor 2004) to terminal 2026 (the source of transistor 2002 and the drain of transistor 2004). Transistor 2016 is connected essentially as a diode. The voltage level appearing at output terminal 2024 is shifted up by the drain-source (gate) voltage of enhancement mode transistor 2016 and appears at terminal 2022 (the gate and drain of transistor 2016 and the gates of transistors 2010 and 2002). Depletion mode transistor 2002 acts as first source follower and accordingly the voltage appearing at the gate thereof (terminal 2022) also appears at the source thereof (terminal 2026) with little offset. Transistor 2002 does not provide as ideal source follower action as transistor 2004 since the gate-to-drain voltage of transistor 2002 does vary somewhat as a signal (not shown) applied to input terminal 2001 varies. The combination of transistors 2016 and 2002 function to cause the voltage of terminal 2026 (the drain of transistor 2004) to be held at an essentially fixed voltage (essentially the drain-source (gate) voltage of transistor 2016) above the drain (terminal 2024) of transistor 2004 even with changes in the voltage of terminal 2024. The voltage at terminal 2022 is a function of the size of transistor 2016 relative to the sizes of transistors 2010, 2012 and 2014 and the current flowing therethrough which is a function of the sizes of transistors 2010, 2012, 2014 and 2016 and the magnitudes of voltage sources +V2000 and −V2000.

Since, as will be discussed latter herein, transistor 2004 acts as a near ideal source follower during operation of circuit 2000 the voltage of output terminal 2024 (the drain of transistor 2004) is essentially identical to a voltage (not shown) applied to input terminal 2001 (the gate of transistor 2004). Accordingly, the voltage of terminal 2026 (the drain of transistor 2004) is held at a positive essentially fixed voltage above the gate (input terminal 2001) of transistor 2004. This positive essentially fixed voltage is selected to facilitate the operation of transistor 2004 in a high gain portion of its operating range.

Transistor 2008 has the gate and source thereof coupled together to −V2000. As such it acts as an essentially constant current source which gives rise to a first current which flows from +V2000 serially through transistors 2002, 2004, 2006 and then through transistor 2008 and then to −V2000. Transistors 2010 and 2012 are also configured with their gates and sources coupled together and also serve as current sources which give rise to a second current which flows from +V2000 serially through transistors 2010, 2016, 2012, 2014 and then to −V2000.

Transistors 2014 and 2006 form a second feedback circuit (also denoted as a second feedback circuit means or as a second voltage clamp circuit) from terminal 2020 (the gate and source of transistor 2008) to terminal 2030 (the drain of transistor 2008). Transistor 2014 is connected essentially as a diode. The voltage level of terminal 2028 is shifted up by the drain-source (gate) voltage of enhancement mode transistor 2014 and appears at terminal 2028 (the gate of transistor 2006). Depletion mode transistor 2006 acts as a second source follower and accordingly the voltage appearing at the gate thereof (terminal 2028) also appears at the source thereof (terminal 2030), which coupled to the drain of transistor 2008, with little offset. Transistor 2006 does not provides as ideal source follower action as transistor 2004 since the gate-to-drain voltage of transistor 2006 does vary as the output signal on the output terminal 2024 varies. The combination of transistors 2014 and 2006 function to cause the voltage of terminal 2030 (the drain of transistor 2008) to be held at an essentially constant fixed voltage above the gate and source (terminal 2020) of transistor 2008. The voltage at terminal 2028 is a function of the size of transistor 2014 relative to the sizes of transistors 2010, 2012 and 2016 and the magnitudes of the voltage sources +V2000 and −V2000.

The two feedback circuits and the selection of transistors 2002 and 2006 to be essentially identical, the selection of transistors 2014 and 2016 to be essentially identical and the selection of transistors 2012 and 2016 to be essentially identical, results in the drain-to-source voltages of transistors 2004 and 2008 being essentially identical. Because the current flowing through transistors 2004 and 2008 is also identical, the gate-to-source voltage of transistor 2004 is forced to be the same as the gate-to-source voltage of transistor 2008 which is zero volts. Accordingly, transistor 2004 acts as a near ideal source follower and thus signals (not shown) applied to input terminal 2001 appear essentially without offset at circuity 2000 output terminal 2024. Since the potential of the source (terminal 2024) of transistor 2004 is essentially the same as that potential applied to the gate (input terminal 2001) thereof, the drain-to-gate potential of transistor 2004 is essentially held constant even with variations in the signal levels applied to input terminal 2001. This is one feature which is needed for transistor 2004 to function as an ideal source follower. Thus buffer circuitry 2000 acts as a high input impedance, low output impedance, high speed, near unity gain MOS buffer which can be fabricated in the silicon of a silicon-on-sapphire substrate or in bulk silicon.

In a typical embodiment +V2000 and −V2000 have voltage magnitudes of about +3 and −3 volts, respectively, all of the transistors are MOS transistors with each having a channel length of about 2 microns, transistors 2002, 2004, 2006 and 2008 each have a channel width in the range of about 200 to 400 microns, transistors 2014 and 2016 each have a channel width in the range of about 10 to 20 microns and transistors 2010 and 2012 each have a channel width in the range of about 20 to 40 microns.

The embodiment of the FIGURE is shown and described in a copending patent application, Ser. No. 07/356,084, which is being filed concurrently with this patent application and in which there is a common assignee and one common inventor.

It is to be appreciated and understood that the specific embodiments described are merely illustrative of the general principles of the invention. Various modifications may be made consistent with the principles set forth. For example, all of the transistors of the FIGURE could be p-channel transistors provided the voltage supplies are appropriately modified. Still further, the transistors 2002 and 2006 could be replaced by other types of source followers or could be replaced by other transistors which have lower gate-to-source voltages than the drain-to-source (gate) voltages of transistors 2014 and 2016. Still further, transistors 2010 and 2012 could be replaced by a variety of different current sources. Still further, all of the transistors can be Junction Field Effect Transistors (JFETs). Still further, some of the transistors could be JFETs while others are MOS transistors. Still further, buffer circuitry 2000 can be modified in a first manner such that transistors 2002 and 2016 are eliminated. In this modified buffer circuitry the drain (terminal 2016) of transistor 2004 is coupled directly to +V2000 and the gate and source of transistor 2010 are coupled directly to the drain of transistor 2012. This modified buffer circuitry, although it has a gain which is somewhat less than buffer circuitry 2000 and has a greater offset voltage than buffer circuitry 2000, is useful in some applications. Still further, buffer circuitry 200 can be modified in a second manner such that transistors 2006 and 2014 are eliminated. In this modified buffer circuitry the source of transistor 2004 is coupled directly to the drain of transistor 2008 and the gate and source of transistor 2012 are directly coupled to −V2000. Still further, the combination of transistors 2004, 2016 and 2002 is useful in many applications. Still further, the combination of transistors 2008, 2014 and 2006 is useful in many applications.

What is claimed is:

1. Circuitry comprising:
   first and second essentially identical depletion mode field effect transistors each having a gate terminal and first and second output terminals;
   means coupling the first output terminal of the first transistor to the second output terminal of the second transistor;
   a circuitry input terminal being coupled to the gate terminal of the first transistor and a circuitry output terminal being coupled to the first output terminal of the first transistor;
   the gate terminal and first output terminal of the second transistor being coupled together;
   first feedback circuit means coupled between the first and second output terminals of the first transistor for establishing an essentially fixed potential difference between the output terminals of the first transistor during operation of the circuitry;
   second feedback circuit means coupled between the first and second output terminals of the second transistor for establishing an essentially fixed potential difference between the output terminals of the second transistor during operation of the circuitry; and
   the first and second feedback circuit means being adapted such that the voltage across the output terminals of the first transistor is essentially equal to the voltage across the output terminals of the second transistor during operation of the circuitry.

2. The circuitry of claim 1 wherein:
   the first feedback circuit means comprises third and fourth field effect transistors each having a gate terminal and first and second output terminals;
   the second feedback circuit means comprises fifth and sixth field effect transistors each having a gate terminal and first and second output terminals;
   the first output terminal of the third and fifth transistors being coupled to the first output terminals of the first and sixth transistors and to the circuitry output terminal;
   the gate and second output terminal of the third transistor being coupled to the gate of the fourth transistor;
   the gate and first output terminal of the fifth transistor being coupled to the gate of the sixth transistor;
   the first output terminal of the fourth transistor being coupled to the first output terminal of the first transistor;
   the first and second output terminals of the sixth transistor being coupled to the first output terminal of the first transistor and to the first output terminal of the second transistor, respectively, such that the first output terminal of the first transistor is coupled to the first output terminal of the second transistor through the sixth transistor; and
   the second output terminal of the fifth transistor being coupled to the gate terminal and to the first output terminal of the second transistor.

3. The circuitry of claim 2 further comprising:
   seventh and eighth field effect transistors each having a gate terminal and first and second output terminals;
   the gate and first output terminal of the seventh transistor being coupled to the second output terminal of the third transistor;
   the first output terminal of the eighth transistor being coupled to the first output terminals of the first, third and sixth transistors, and the gate terminal and the second output terminal of the eighth transistor being coupled to the gate terminal and the first output terminal of the fifth transistor and to the gate terminal of the sixth transistor such that the first output terminal of the third transistor is coupled to the first output terminal of the fifth transistor through the eighth transistor; and
   the third and fifth transistors have essentially the same voltage across the respective output terminals thereof during operation of the circuitry, and the seventh and eighth transistors are essentially identical.

4. The circuitry of claim 3 wherein the second output terminals of the fourth and seventh transistors are coupled together.

5. The circuitry of claim 4 wherein the fourth, sixth, seventh and eighth transistors are depletion mode field effect transistors and the third and fifth transistors are enhancement mode field effect transistors.

6. The circuitry of claim 5 wherein all of the transistors are n-channel metal-oxide-semiconductor (MOS) transistors.

7. The circuitry of claim 6 wherein all the MOS transistors are of the same conductivity type and are silicon.

8. The circuitry of claim 7 wherein the circuitry is formed in the silicon of a silicon-on-sapphire substrate.

9. Circuitry comprising:
first and second essentially identical depletion mode field effect transistors each having a gate terminal and first and second output terminals;
the first output terminal of the first transistor being coupled to the first output terminal of the second transistor;
the gate terminal and the second output terminal of the second transistor being coupled together;
a circuitry input terminal being coupled to the gate terminal of the first transistor and a circuitry output terminal being coupled to the first output terminal of the first transistor;
first and second voltage clamp circuits each having an input terminal and an output terminal;
the input and output terminals of the first voltage clamp circuit being coupled to the first and second output terminals, respectively, of the first transistor;
the input and output terminals of the second voltage clamp circuit being coupled to the first and second output terminals, respectively, of the second transistor; and
the first and second voltage clamp circuits being adapted such that the voltage differences between the respective output terminals of the first and second transistors during operation of the circuitry are essentially equal.

10. The circuitry of claim 9 wherein:
the first voltage clamp circuit comprises a third transistor which is an enhancement mode field effect transistor having a gate terminal and first and second output terminals and further comprises a first source follower device having a control terminal and first and second output terminals;
the second voltage clamp circuit comprises a fourth transistor which is an enhancement mode field effect transistor having a gate terminal and first and second output terminals and further comprises a second source follower device having a control terminal and first and second output terminals;
the first output terminals of the third and fourth transistors being coupled to the first output terminal of the first transistor;
the gate and second output terminal of the third transistor being coupled to the control terminal of the first source follower;
the first output terminal of the first source follower being coupled to the second output terminal of the first transistor;
the first output terminal of the second source follower being coupled to the first output terminal of the first transistor, and the second output terminal of the second source follower being coupled to the first output terminal of the second transistor such that the first output terminal of the first transistor is coupled to the first output terminal of the second transistor through the second source follower;
the gate and first output terminal of the fourth transistor being coupled to the control terminal of the second source follower; and
the second output terminal of the fourth transistor being coupled to the gate and second output terminal of the second transistor.

11. The circuitry of claim 10 further comprising:
fifth and sixth field effect transistors each having a gate terminal and first and second output terminals;
the gate terminal and the first output terminal of the fifth transistor being coupled to the gate terminal of the third transistor;
the first output terminal of the sixth transistor being coupled to the circuitry output terminal; and
the gate terminal and the second output terminal of the sixth transistor being coupled to the first output terminal of the fourth transistor such that the first output terminal of the third transistor is coupled to the first output terminal of the fourth transistor through the sixth transistor.

12. The circuitry of claim 11 wherein the fifth and sixth transistors are depletion mode transistors and the first and second source followers are seventh and eighth depletion mode field effect transistors, respectively, which each have a gate terminal and first and second output terminals.

13. The circuitry of claim 12 wherein the second output terminals of the fifth and seventh transistors are coupled together.

14. The circuitry of claim 13 wherein all the transistors are of the same conductivity type and are metal-oxide-semiconductor (MOS) transistors.

15. The circuitry of claim 14 wherein all the MOS transistors are silicon.

16. The circuitry of claim 15 wherein the circuitry is silicon-on-sapphire.

17. Circuitry comprising:
first and second essentially identical depletion mode field effect transistors each having a gate terminal and first and second output terminals;
third and fourth essentially identical depletion mode field effect transistors each having a gate terminal and first and second output terminals;
fifth and sixth essentially identical depletion mode field effect transistors each having a gate terminal and first and second output terminals;
seventh and eighth essentially identical enhancement mode field effect transistors each having a gate terminal and first and second output terminals;
a circuitry input terminal being coupled to the gate terminal of the first transistor and a circuitry output terminal being coupled to the first output terminal of the first transistor;
the first output terminal of the first transistor being coupled to the first output terminals of the fourth, sixth and seventh transistors and to a circuitry output terminal;
the gate and first output terminals of the seventh transistor being coupled to the gate and first output terminals of the fifth transistor and to the gate terminal of the third transistor;
the first output terminal of the third transistor being coupled to the second output terminal of the first transistor;

the second output terminal of the fourth transistor being coupled to the first output terminal of the second transistor;

the gate terminal and the second output terminal of the second transistor being coupled to the first output terminal of the eighth transistor; and the gate terminal and the second output terminal of the eighth transistor being coupled to the gate terminal and the second output terminal of the sixth transistor and to the gate terminal of the fourth transistor.

18. The circuitry of claim 17 wherein the second output terminals of the third and fifth transistors are coupled together.

19. The circuitry of claim 18 wherein the transistors are all silicon metal-oxide-silicon (MOS) transistors.

20. The circuitry of claim 19 wherein the MOS transistors are all formed in a silicon-on-sapphire (SOS) substrate.

21. Circuitry comprising:
a first depletion mode field effect transistor having a gate and first and second output terminals;
a second depletion mode field effect transistor having a gate and first and second output terminals;
a third enhancement mode field effect transistor having a gate and first and second output terminals;
the first and second output terminals of the first transistor being coupled to the first output terminal of the second transistor and to the first output terminal of the third transistor, respectively;
the gate and second output terminal of the third transistor being coupled to the gate of the second transistor; and
means coupled to the second output terminal of the first transistor for providing a conduction path.

22. The circuitry of claim 21 further comprising:
the means for providing a conduction path comprises fourth and fifth depletion mode field effect transistors each having a gate and first and second output terminals;
a sixth enhancement mode field effect transistor having a gate and first and second output terminals;
the first and second output terminals of the fourth transistor being coupled to the second output terminal of the first transistor and to the first output terminal of the fifth transistor, respectively;
the gate of the fourth transistor being coupled to the gate and first output terminal of the sixth transistor; and
the second output terminal of the sixth transistor being coupled to the gate and the second output terminal of the fifth transistor.

23. The circuitry of claim 22 further comprising:
seventh and eighth depletion mode field effect transistors each having a gate and first and second output terminals;
the first output terminal of the seventh transistor being coupled to the second output terminal of the second transistor;
the gate and second output terminal of the seventh transistor being coupled to the gate and second output terminal of the third transistor;
the first output terminal of the eighth transistor being coupled to the second output terminal of the first transistor; and
the gate and second output terminal of the eighth transistor being coupled to the gate and first output terminal of the sixth transistor.

24. Circuitry comprising:
first and second essentially identical depletion mode field effect transistors each having a gate terminal and first and second output terminals;
the first output terminal of the first transistor being coupled to the first output terminal of the second transistor;
a circuitry input terminal being coupled to the gate terminal of the first transistor and a circuitry output terminal being coupled to the first output terminal of the first transistor;
the gate terminal and second output terminal of the second transistor being coupled together; and
feedback circuit means coupled between the first and second output terminals of the first transistor for establishing an essentially fixed potential difference between the output terminals of the first transistor during operation of the circuitry.

25. Circuitry comprising:
first and second essentially identical depletion mode field effect transistors each having a gate terminal and first and second output terminals;
the first output terminal of the first transistor being coupled to the first output terminal of the second transistor;
a circuitry input terminal being coupled to the gate terminal of the first transistor and a circuitry output terminal being coupled to the first output terminal of the first transistor;
the gate terminal and second output terminal of the second transistor being coupled together; and
feedback circuit means coupled between the first and second output terminals of the second transistor for establishing an essentially fixed potential difference between the output terminals of the second transistor during operation of the circuitry.

26. Circuitry comprising:
first and second depletion mode field effect transistors, each transistor having a gate and source and drain electrodes defining end of a conduction path;
means connecting one end of the conduction path of the first transistor to one end of the conduction path of the second transistor; and
feedback circuit means coupled between the source and drain electrodes of the first transistor for translating the amplitude and polarity of any voltage changes produced at the source electrode of the first transistor and applying the voltage change with the same amplitude and polarity to the drain electrode of the first transistor for establishing an essentially fixed voltage across the source and drain electrodes of the first transistor during operation of the circuitry.

27. Circuitry comprising:
first and second depletion mode field effect transistors, each having a gate and a drain-source conduction path with the drain-source conduction path of the first transistor being serially coupled to the drain-source conduction path of the second transistor; and
feedback circuit means coupled across the drain-source conduction path of the first transistor for translating the amplitude and polarity of any voltage changes produced at the source of the first transistor and applying the voltage changes with the same amplitude and polarity to the drain of the first transistor for establishing an essentially fixed voltage across the drain-source conduction path of the first transistor during operation of the circuitry.

28. A combination comprising:

first and second field effect transistors each having first and second electrodes defining end of a conduction path and a gate electrode for controlling the conductivity of the conduction path;

the second transistor having a threshold voltage which is greater than the theshold voltage of the first transistor; and feedback means, including the gate and first electrode of the second transistor, coupled to the first and second electrodes of the first transistor for establishing a potential across the conduction path of the first transistor which is substantially equal to the threshold voltage of the second transistor.

29. A combination comprising:

first and second field effect transistors each having first and second electrodes defining ends of a conduction path and a gate electrode for controlling the conductivity of the conduction path;

the second transistor having a threshold voltage which is greater than the theshold voltage of the first transistor; and feedback means, including the gate and first electrode of the second transistor, coupled to the first and second electrodes of the first transistor of establishing an essentially fixed potential difference between the first and second electrodes of the first transistor during operation of the combination.

30. The combination of claim 29 wherein the first transistor is a depletion mode transistor and the second transistor is an enhancement mode transistor.

31. The combination of claim 30 wherein the first and second transistors are of the same conductivity type.

32. The combination of claim 31 wherein the first and second transistors are of N-type conductivity.

* * * * *